United States Patent [19]

Kurata et al.

[11] Patent Number: 4,775,645
[45] Date of Patent: Oct. 4, 1988

[54] METHOD OF PRODUCING A FLAT LED PANEL DISPLAY

[75] Inventors: Kazumine Kurata, Sagamihara; Hideo Tsujikawa, Narashino; Hiroshi Nakamura, Yokohama, all of Japan

[73] Assignee: Victor Company of Japan, Limited, Yokohama, Japan

[21] Appl. No.: 908,929

[22] Filed: Sep. 15, 1986

Related U.S. Application Data

[62] Division of Ser. No. 683,885, Dec. 20, 1984, abandoned.

[30] Foreign Application Priority Data

Dec. 26, 1983 [JP] Japan ................... 58-245893

[51] Int. Cl.$^4$ ............... H01L 27/15; H01L 33/00
[52] U.S. Cl. ................... 437/184; 437/226; 437/904; 437/905; 437/51; 357/55; 357/17; 357/19; 148/DIG. 28
[58] Field of Search ............... 29/569 L, 580; 357/17, 357/32, 45; 313/498, 499, 500, 501; 437/127, 905, 904, 226, 51

[56] References Cited

U.S. PATENT DOCUMENTS 4,236,296 12/1980 Woolhouse et al. ............ 29/569 L
4,275,404 6/1981 Cassiday et al. ............... 29/569 L
4,538,342 9/1985 Camlibel et al. ............... 29/569 L

FOREIGN PATENT DOCUMENTS 0102590 6/1983 Japan .......................... 357/17

OTHER PUBLICATIONS

Tanabe et al., "High Accuracy Die Bonding Technology for LED Array", 35th Electronic Components Conference, N.Y., U.S.A.: IEEE 1985, pp. 460–464 of 516 p.
Wickenden, "High-Resolution LED Display for Avionic Application", GEC Journal of Science & Tech., vol. 46, No. 2, 1980, pp. 91–95.

Primary Examiner—Brian E. Hearn
Assistant Examiner—Beverly A. Pawlikowski
Attorney, Agent, or Firm—Jordan and Hamburg

[57] ABSTRACT

A flat LED panel display with LED elements arranged in a high density and a method of producing such a display are disclosed. A conductive layer is deposited on a ceramic substrate and bonded to one surface of an LED wafer by a conductive paste. A plurality of electrodes are arranged on the other surface of the LED wafer in rows and columns to define a two-dimensional pattern. Slits are formed along the rows or the columns each to a depth which extends from the other surface of the LED wafer to the ceramic substrate. Other slits are formed perpendicular to the first-mentioned slits each with a depth which extends from the other surface of the LED wafer to a position deeper than it but short of the ceramic substrate.

10 Claims, 2 Drawing Sheets

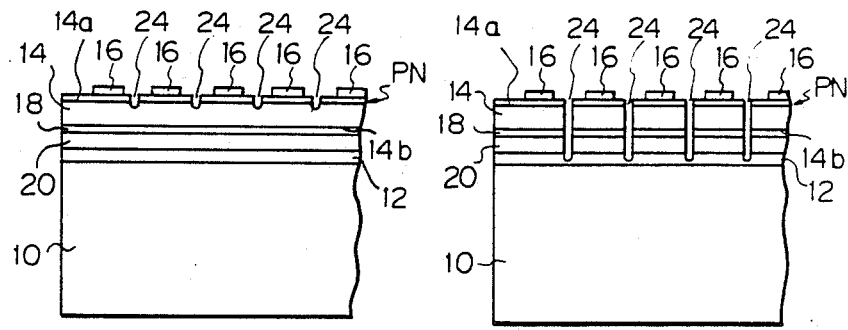
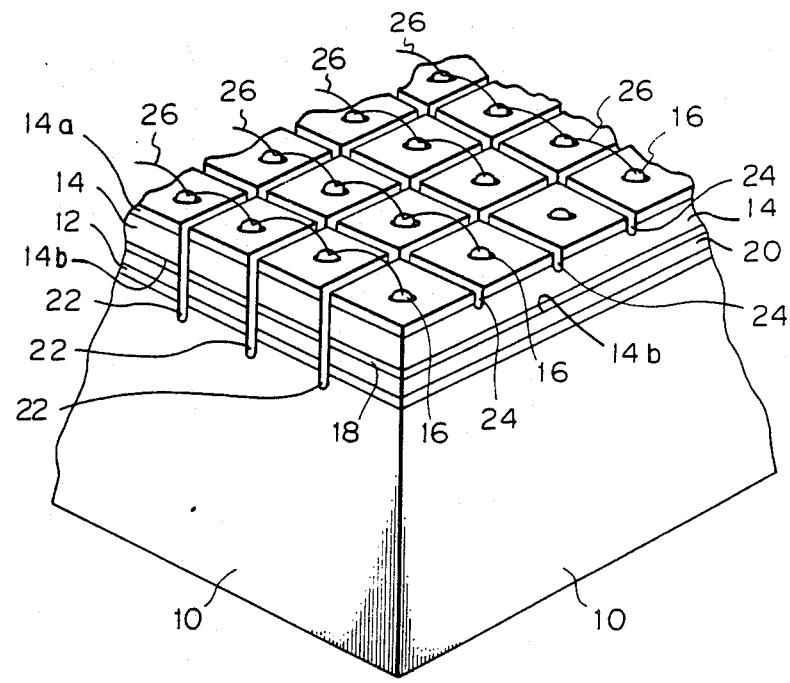

METHOD OF PRODUCING A FLAT LED PANEL DISPLAY

This application is a division of application Ser. No. 683,885, filed 12/20/84, now abandoned.

BACKGROUND OF THE INVENTION

The present invention relates to a flat light emitting diode (LED) panel display with LED elements densely arranged thereon and a method of producing such a panel display.

Various types of flat LED panel displays are known in the art as typified by one having numerous LED lamps arranged in rows and columns in a desired two-dimensional pattern at a predetermined pitch, and one having numerous LED chips arranged on a ceramic substrate at a predetermined pitch in rows and columns to define a desired pattern.

A problem encountered with the prior art LED panel displays of the type stated is that they are relatively expensive due to the high material cost. Another problem is that a dense arrangement of LED elements is impracticable since it is difficult to arrange the LED elements at a pitch smaller than 1 millimeter.

SUMMARY OF THE INVENTION

It is therefore an object of the present invention to provide a flat LED panel display which allows LED elements to be installed in an unprecedented density and a method of producing the same.

It is another object of the present invention to provide a flat LED panel display with an LED element density which is free to choose and a method of producing the same.

It is another object of the present invention to provide a flat LED panel which is inexpensive and easy to produce.

It is another object of the present invention to provide a generally improved flat LED panel display.

A method of producing a flat light emitting diode (LED) display of the present invention comprises the steps of providing an insulative substrate on at least one surface of which a conductive layer is deposited, providing an LED wafer on one surface of which a plurality of electrodes are arranged at a predetermined pitch and in rows and columns to define a predetermined two-dimensional pattern, bonding the conductive layer on the insulative substrate and othe other surface of the LED wafer, forming a plurality of first slits each extending along one of the rows and columns of the two-dimensional pattern, each of the first slits having a depth which extends from the one surface of the LED wafer to the insulative substrate, and forming a plurality of second slits each extending along the other of the rows and columns of the two-dimensional pattern, each of the second slits having a depth which extends from the one surface of the LED wafer to a position short of the insulative substrate.

A flat light emitting diode panel display of the present invention comprises a flat insulative substrate, a flat light emitting diode wafer having a p-n junction face therein, one surface of the diode wafer being bonded to one surface of the insulative substrate through a conductive layer, and a plurality of electrodes disposed on the other surface of the diode wafer two-dimensionally in first and second directions which are perpendicular to each other, to form rows and columns. The panel display is provided with a plurality of first parallel slits extending in the first direction on the other surface of the diode wafer to isolate the electrodes to respective rows, and a plurality of second parallel slits in the second direction on the other surface of the diode wafer to isolate the electrodes to respective columns. The first parallel slits penetrate from the other surface of the diode wafer into the insulative substrate. Each of the second parallel slits extends from the other surface of the diode wafer to a point which is deeper than the p-n junction face of the diode wafer and shallower than the one surface of the insulative substrate. The electrodes of each column are electrically connected.

In accordance with the present invention, a flat LED panel display with LED elements arranged in a high density and a method of producing such a display are disclosed. A conductive layer is deposited on a ceramic substrate and bonded to one surface of an LED wafer by a conductive paste. A plurality of electrodes are arranged on the other surface of the LED wafer in rows and columns to define a two-dimensional pattern. Slits are formed along the rows or the columns each to a depth which extends from the other surface of the LED wafer to the ceramic substrate. Other slits are formed perpendicular to the first-mentioned slits each with a depth which extends from the other surface of the LED wafer to a position deeper than it but short of the ceramic substrate.

The above and other objects, features and advantages of the present invention will become apparent from the following detailed description taken with the accompanying drawings.

BRIEF DESCRIPTION OF THE DRAWINGS

FIGS. 2A and 2B are sectional side elevations showing exemplary extreme depths of slits which are provided by a step shown in FIG. 1F; and FIG. 3 is a fragmentary perspective view of the LED panel display shown in FIGS. 1A-1F.

DESCRIPTION OF THE PREFERRED EMBODIMENTS

While the flat LED panel display of the present invention is susceptible of numerous physical embodiments, depending upon the environment and requirements of use, a substantial number of the herein shown and described embodiments have been made, tested and used, and all have performed in an eminently satisfactory manner.

Reference will be made to the accompanying drawings for describing in detail a flat LED panel display of the present invention and a method of producing it.

Referring to FIGS. 1A-1F, there is shown a series of steps for producing the LED panel display in accordance with the present invention.

Figure 1A:
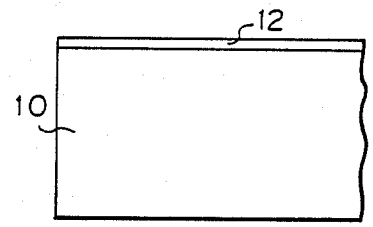
FIGS. 1A-1F are sectional side elevations showing a procedure for producing a flat LED panel display in accordance with the present invention.

As shown in FIG. 1A, the procedure starts with preparing a substrate 10 made of such an insulative material as ceramic and provided with a conductive layer 12 on at least one surface thereof. The conductive layer 12 may be deposited by sputtering or vacuum evaporating of copper, for example, to a thickness of 50 to 100 $\mu$m. In the illustrative embodiment, the substrate 10 is assumed to be made of ceramic and dimensioned 25.4 millimeters $\times$ 25.4 millimeters $\times$ 0.6 millimeters.

Figure 1B:
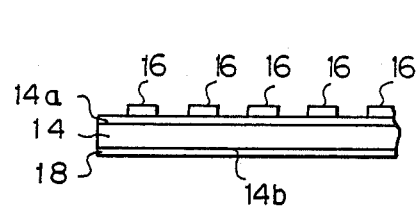

Prepared at the same time is, as shown in FIG. 1B, an LED wafer 14 made of GaP. The LED wafer 14 carries a number of electrodes 16 made of gold alloy (AuBe) on its p-type crystal face 14a and an electrode 18 made of gold alloy (AuSi) on its n-type crystal face 14b. The electrodes 16 are arranged two-dimensionally at a pitch of 397 μm and each has a diameter of 100 μm.

Figure 1C:
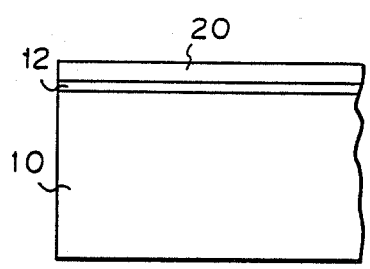
Figure 1D:
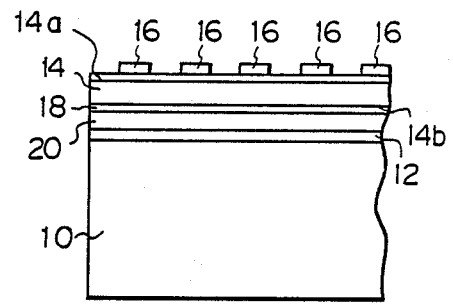

As shown in FIG. 1C, a conductive paste 20 (silver paste, for example, which is a mixture of silver powder and epoxy resin) is applied to the conductive layer 12 of the ceramic substrate 10 shown in FIG. 1A. Then, the electrode 18 on the n-type crystal surface 14b of the GaP LED wafer 14 of FIG. 1B is pressed against the paste 20 as shown in FIG. 1D. The resulting assembly is heated in an oven at 150° C. to harden the paste 20. As a result, the conductive layer 12 and the electrode 18 are bonded together by the paste 20 in mutual electrical conduction, as shown in FIG. 1D. The primary requisite during such a procedure is that the paste 20 be applied to the conductive layer 12 to an even thickness with no bubbles contained therein.

While the conductive layer 12 on the substrate 10 shown in FIG. 1A and the electrode 18 on the LED wafer 14 shown in FIG. 1B have been shown and described as being bonded by the conductive paste 20 in electrical conduction, the conductive bonding may be implemented by any other suitable bonding technique such as using solder or eutectic.

The assembly having the conjoint substrate 10 and wafer 14 as shown in FIG. 1D is cut by a cutter such as a rotary disc type cutter to be provided with two different kinds of slits as will be described. First, the assembly is cut in one direction of the two-dimensional electrode arrangement pattern on the wafer LED 14. This forms slits 22 each extending from one surface of the wafer 14 to penetrate into the substrate 10, as shown in FIGS. 1E and 3.

Figure 1E:
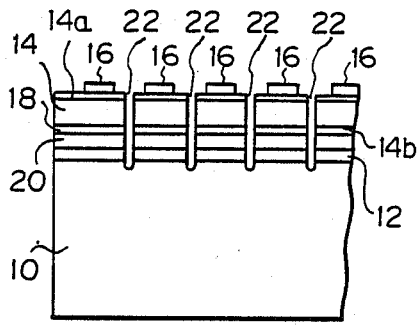
Figure 1F:
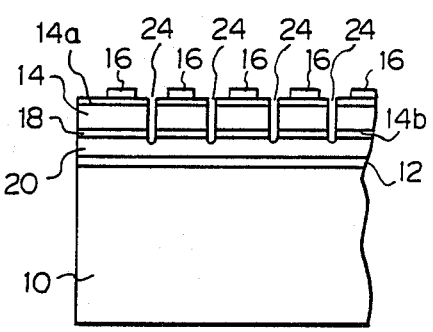

Subsequently, the assembly with the slits 22 cut as shown in FIG. 1E is cut by the cutter perpendicularly to the slits 22 to form slits 24 each of which extends from the surface of wafer 14 to a position deeper than the p-n junction of the wafer 14 but short of the substrate 10, as shown in FIGS. 1F and 3. While the depth of the slits 24 provided by such a step is free to choose insofar as it is deeper than the p-n junction of the wafer 14 but does not reach the substrate 10, it should preferably be one which is advantageous from the machining standpoint.

Extreme examples of the depth of the slits 24 provided by the above step are shown in FIGS. 2A and 2B. Labeled PN in each of FIGS. 2A and 2B is the p-n junction of the LED wafer 14.

As described above, in the illustrative embodiment, the slits 22 each extending from the surface of the LED wafer 14 to the substrate 10 as shown in FIG. 1E are formed in one direction of the two-dimensional electrode pattern on the wafer 14, while the slits 24 each extending from the surface of the wafer 14 to a position deeper than the p-n junction of the wafer 14 and short of the substrate 10 as shown in FIG. 1F are formed in the direction perpendicular to the slits 22. Hence, as shown in FIG. 3, the wafer 14 is provided with numerous and substantially discrete LED elements in a predetermined pattern which correspond in one-to-one relation with the electrodes 16.

The discrete LED elements of the wafer 14 are connected together at the electrode 18 side in a direction parallel to the deeper slits 22 (perpendicular to the sheet surface of FIG. 1E or parallel to the sheet surface of FIG. 1F). Meanwhile, they are electrically isolated from each other in a direction parallel to the shallower slits 24 (parallel to the sheet surface of FIG. 1E or perpendicular to the sheet surface of FIG. 1F).

The numerous LED elements constructed as described above, i.e., the LED elements arranged in mutually perpendicular directions at the pitch of 397 μm in the illustrative embodiment, are separated from each other by the perpendicularly extending slits 22 and 24. Such is effective to prevent light emanating from any of the LEDs from propagating through the crystal to adjacent LEDs to blur information appearing on the display.

As shown in FIG. 3, the electrodes 16 associated with the individual LED elements on the wafer 14 are electrically connected by wires 26 in the direction parallel to the slits 24 (parallel to the sheet surface of FIG. 1E or perpendicular to that of FIG. 1F) by use of a wire bonder, for example.

Although an LED wafer in the illustrative embodiment has been implemented by the GaP wafer 14, it may alternatively be implemented by a GaAsP wafer, GaAlAs wafer, GaAs wafer or any other suitable kind of wafer.

While the electrode pattern in the illustrative embodiment has been provided on the p-type crystal face, it may alternatively be provided on the n-type crystal face or even on both the p- and n-type crystal faces.

If desired, the conductive layer 12 deposited on the ceramic substrate 10 may be conditioned to provide a pattern which corresponds to the electrode pattern.

The present invention may be practiced using an LED wafer on which numerous LED elements are arranged in rows and columns according to a predetermined pattern by means of a known mesa or planar technology.

In addition, the slits 22 and 24 may be attained by means of a laser, a photolithographic method, a wire saw or the like, instead of the rotary disc type cutter shown and described.

In summary, it will be seen that the present invention provides easily and economically a flat LED panel display which carries LED elements in a high density on an LED wafer. This advantage is derived from the fact that the pitch of an electrode pattern formed on the wafer directly define the pitch of the LED elements and, therefore, the latter is controllable as desired merely by varying the former.

Various modifications will become possible for those skilled in the art after receiving the teachings of the present disclosure without departing from the scope thereof.

What is claimed is:

1. A method of producing a flat light emitting diode (LED) display, comprising the steps of:
    (a) providing an insulative substrate on at least one surface of which a conductive layer is formed;
    (b) forming a p-n junction LED wafer having one p-type crystal surface and one n-type crystal surface;
    (c) applying a plurality of electrodes to said p-type crystal surface at a predetermined pitch and in rows and columns to define a predetermined two-dimensional pattern;
    (d) bonding the conductive layer on the insulative substrate and the n-type crystal surface of the LED wafer;

(e) forming a plurality of first slits each extending along one of the rows and columns of the two-dimensional pattern, each of the first slits having a depth which extends from said p-type crystal surface of the LED wafer to the depth of the insulative substrate; and (f) forming a plurality of second slits each extending along the other of the rows and columns of the two-dimensional pattern, each of the second slits having a depth which extends from said p-type crystal surface of the LED wafer to a depth greater than the p-n junction but short of the insulative substrate, whereby said n-type crystal surface continuously contacts said conductive layer along said one of said columns and rows.

2. A method as claimed in claim 1, wherein the step (d) comprises the steps of (g) applying a conductive paste to the conductive layer and (h) pressing said other surface of the LED wafer to the conductive paste and then heating the LED wafer and the conductive paste.

3. A method as claimed in claim 1, wherein the step (d) is effected by solder.

4. A method as claimed in claim 1, wherein the step (d) is effected by eutectic.

5. A method as claimed in claim 1, wherein the steps (e) and (f) are effected by a rotary disc type cutter.

6. A method as claimed in claim 1, wherein the steps (e) and (f) are effected by a laser.

7. A method as claimed in claim 1, wherein the steps (e) and (f) are effected by photolithographic processes.

8. A method as claimed in claim 1, wherein the steps (e) and (f) are effected by a wire saw.

9. A method as claimed in claim 1, wherein the insulative substrate comprises a ceramic substrate.

10. A method as claimed in claim 1, wherein the LED wafer comprises at least one of the group comprising GaP, GaAsP, GaAls and GaAs.

* * * * *